United States Patent [19]
Dorri et al.

[11] Patent Number: 5,396,171
[45] Date of Patent: Mar. 7, 1995

[54] FIELD MAPPING FIXTURE FOR A SUPERCONDUCTING MAGNET FOR IMAGING HUMAN LIMBS

[75] Inventors: Bizhan Dorri, Clifton Park; Evangelos T. Laskaris; Kenneth G. Herd, both of Schenectady; Raymond E. Gabis, Scotia, all of N.Y.

[73] Assignee: General Electric Company, Schenectady, N.Y.

[21] Appl. No.: 345

[22] Filed: Jan. 4, 1993

[51] Int. Cl.⁶ .............................................. G01R 33/28
[52] U.S. Cl. ...................................... 324/318; 335/216
[58] Field of Search .................. 324/318, 319, 322; 128/653.2, 653.5; 335/299, 296, 282, 216

[56] References Cited

U.S. PATENT DOCUMENTS

| | | | |
|---|---|---|---|
| 4,534,358 | 8/1985 | Young | 324/318 |
| 4,587,493 | 5/1986 | Sepponen | 324/319 |
| 4,638,252 | 1/1987 | Bradshaw | 324/300 |
| 4,684,894 | 8/1987 | Bliehall | 324/300 |
| 4,875,485 | 10/1989 | Matsutani | 324/318 |
| 5,059,906 | 10/1991 | Yamanaka | 324/318 |
| 5,085,219 | 2/1992 | Ortendahl et al. | 324/318 |
| 5,093,645 | 3/1992 | Dorri et al. | 335/216 |
| 5,136,244 | 8/1992 | Jones et al. | 324/318 |

FOREIGN PATENT DOCUMENTS 3272739 12/1991 Japan ........................ 128/653.2

Primary Examiner—Kenneth A. Wieder
Assistant Examiner—Raymond Y. Mah
Attorney, Agent, or Firm—Paul R. Webb, II

[57] ABSTRACT

This invention relates to a field mapping fixture for mapping the magnetic fields of a superconducting magnet. Such structures of this type, generally, are capable of measuring the magnetic fields of a relatively small imaging volume.

5 Claims, 2 Drawing Sheets

5,396,171

FIELD MAPPING FIXTURE FOR A SUPERCONDUCTING MAGNET FOR IMAGING HUMAN LIMBS

BACKGROUND OF THE INVENTION

1. Field of the Invention

This invention relates to a field mapping fixture for mapping the magnetic fields of a superconducting magnet. Such structures of this type, generally, are capable of measuring the magnetic fields of a relatively small imaging volume.

2. Description of the Related Art

In magnetic resonance (MR) imaging systems, the magnetic field inhomogeneities has to be less than a few parts per million (ppm) for producing good images. Therefore, a superconducting magnet is designed for a homogeneous field distribution of only a few (ppm) within the imaging volume. However, once built, due to the manufacturing tolerances, lead routings, and other manufacturing difficulties, the ppm inhomogeneities are usually in the range of hundreds. Active or passive shimming needs to be used to homogenize the magnetic field.

In recent years, due to its lower cost, simplicity, and capabilities, passive shimming has been the preferred method of field inhomogeneity correction. However, due to the compact structure of an imaging system which images only human limbs, the space available for passive shimming is extremely limited. In order to keep the length of the MR system down and the inside diameter of the system large, the magnet coils and the gradient coil need to be physically very close. This is in fact the area where passive shims need to be placed. Therefore, a passive shimming system needs to be designed which will occupy the least amount of physical space.

While shimming the magnet, the magnetic field needs to be measured at a number of points over the surface of the imaging volume. The imaging volume of the superconducting magnet for imaging human limbs as set forth in U.S. patent application Ser. No. (08/000,344 filed Jan. 4, 1993 and pending (RD-22,167), entitled "SUPERCONDUCTING MAGNET FOR IMAGING HUMAN LIMBS" to Laskaris et al. and assigned to the same assignee as the present invention, is approximately a 10 centimeter diameter sphere. Therefore, a mapping fixture which has a low weight and can very accurately position the probe at all the measuring points of the small imaging volume is needed.

It is apparent from the above that there exists a need in the art for a mapping fixture which is light weight and compact through simplicity of parts and uniqueness of structure, and which at least equals the mapping characteristics of known mapping systems, but which at the same time is capable of mapping a relatively small imaging volume. It is a purpose of this invention to fulfill this and other needs in the art in a manner more apparent to the skilled artisan once given the following disclosure.

SUMMARY OF THE INVENTION

Generally speaking, this invention fulfills these needs by providing a mapping fixture apparatus for measuring a magnetic field in a superconducting magnet, comprising a first holder means, a second holder means rotationally attached to said first holder means, a guide means slidably attached to said second holder means, and a magnetic field measuring means located substantially within said guide means.

In certain preferred embodiments, the first holder means and the second holder means are constructed of Delrin ® 510. Also, the guide means is constructed of aluminum. Finally, the magnetic field measuring means is a nuclear magnetic resonance (NMR) probe.

In another further preferred embodiment, the mapping fixture allows the operator to accurately measure the inhomogeneity of the imaging volume even though the imaging volume is relatively small.

The preferred mapping fixture, according to this invention, offers the following advantages: lightness in weight; compactness; ease of assembly; accuracy; repeatability; excellent magnetic field measuring characteristics; ease of collection of magnetic field data; good economy; and high strength for safety. In fact, in many of the preferred embodiments, these factors of lightness in weight, compactness, excellent magnetic field measuring characteristics and ease of collection of magnetic field data points are optimized to an extent that is considered higher than heretofore achieved in prior, known mapping fixtures.

BRIEF DESCRIPTION OF THE DRAWINGS

The above and other features of the present invention which will be more apparent as the description proceeds are best understood by considering the following detailed description in conjunction with the accompanying drawings wherein like character represent like parts throughout the several views and in which.

DETAILED DESCRIPTION OF THE INVENTION

Figure 1:
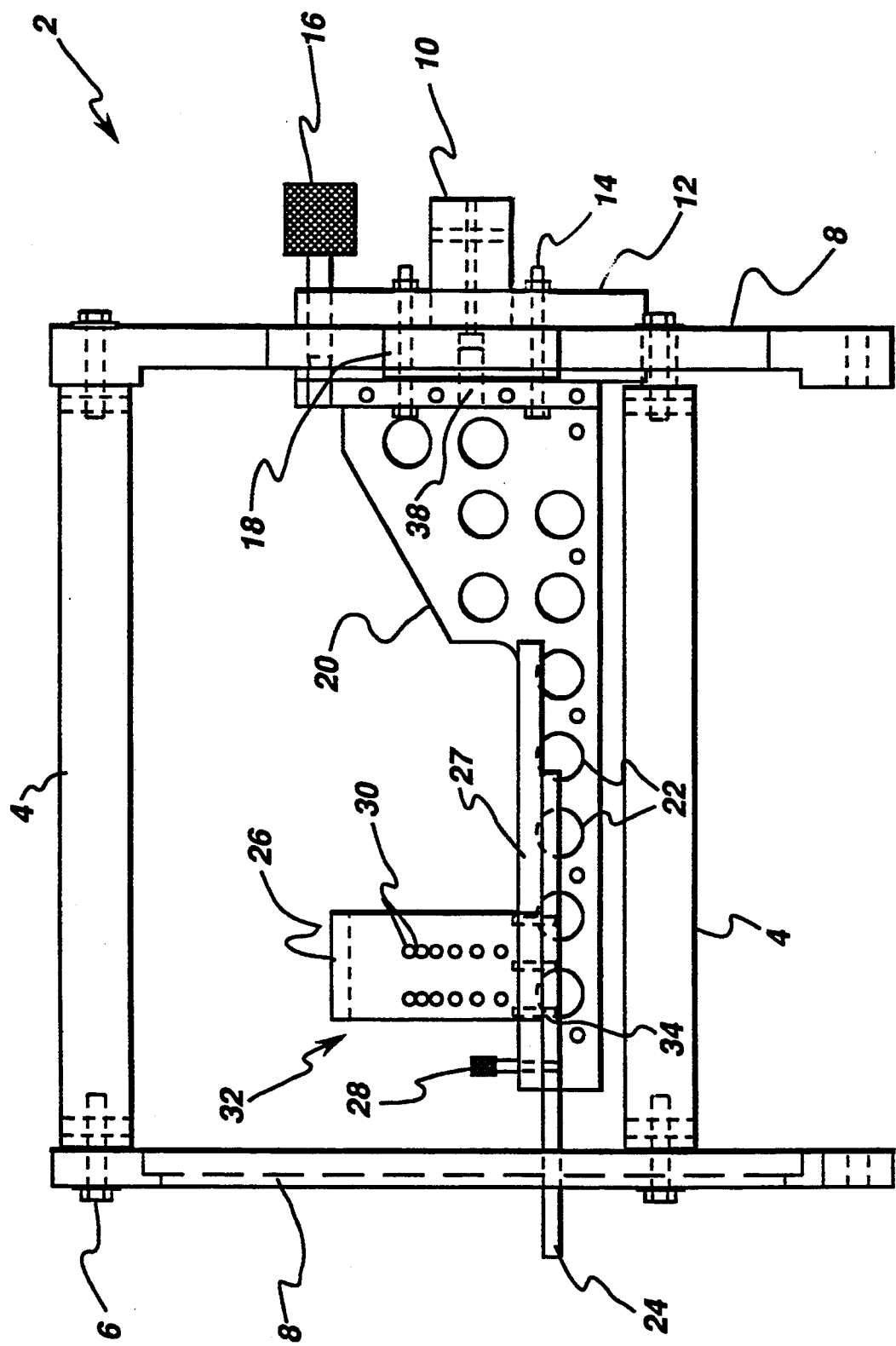
FIG. 1 is a side plan view of a mapping fixture, according to the present invention.

FIG. 1 illustrates mapping fixture 2. Fixture 2 includes, in part, retainer ring 4, end plate 8, end cap 10, flanges 12, 18, holder 20, guide 26, and probe 32. In particular, ring 4, preferably is constructed of aluminum. Ring 4 is rigidly connected to plate 8 by conventional fasteners 6. Plate 8, preferably, is constructed of Delrin ® 510. Delrin ® 510 is used because of its low molecular weight and high strength. Flange 18 is rigidly attached to holder 20 by conventional fastener 38. Flanges 12, 18, preferably, are constructed of Delrin ® 510 and are rigidly attached to conventional end cap 10 by conventional fasteners 14. End cap 10 is constructed of aluminum. Located along flange 12 is conventional index pin 16. Pin 16, preferably, is constructed of aluminum and is used to retain holder 20 in place as holder 20 is rotated by end cap 10.

Located within end plate 18 is holder 20. Holder 20, preferably, is constructed of Delrin ®510. Holes 22 are machined into holder 20 in order to reduce the weight of holder 20. Support plates 27 are attached to holder 20 by conventional fasteners 36 to form a rail for axle 24. Axle 24 is used to move guide 26 axially. Guide 26, which, preferably, is constructed of aluminum, is held on axle 24 by conventional fasteners 34. Support plate 27, preferably, is constructed of Delrin ® 510. Conventional index pin 28 allows guide 26 to be traversed along holder 20 as various measurements of the magnetic field within the superconducting magnet (not shown) are recorded. Located within guide 26 is a conventional NMR probe 32. Probe 32 can be raised and held along the height of guide 26 by conventional fasteners (not shown) which are held in holes 30.

Figure 2:
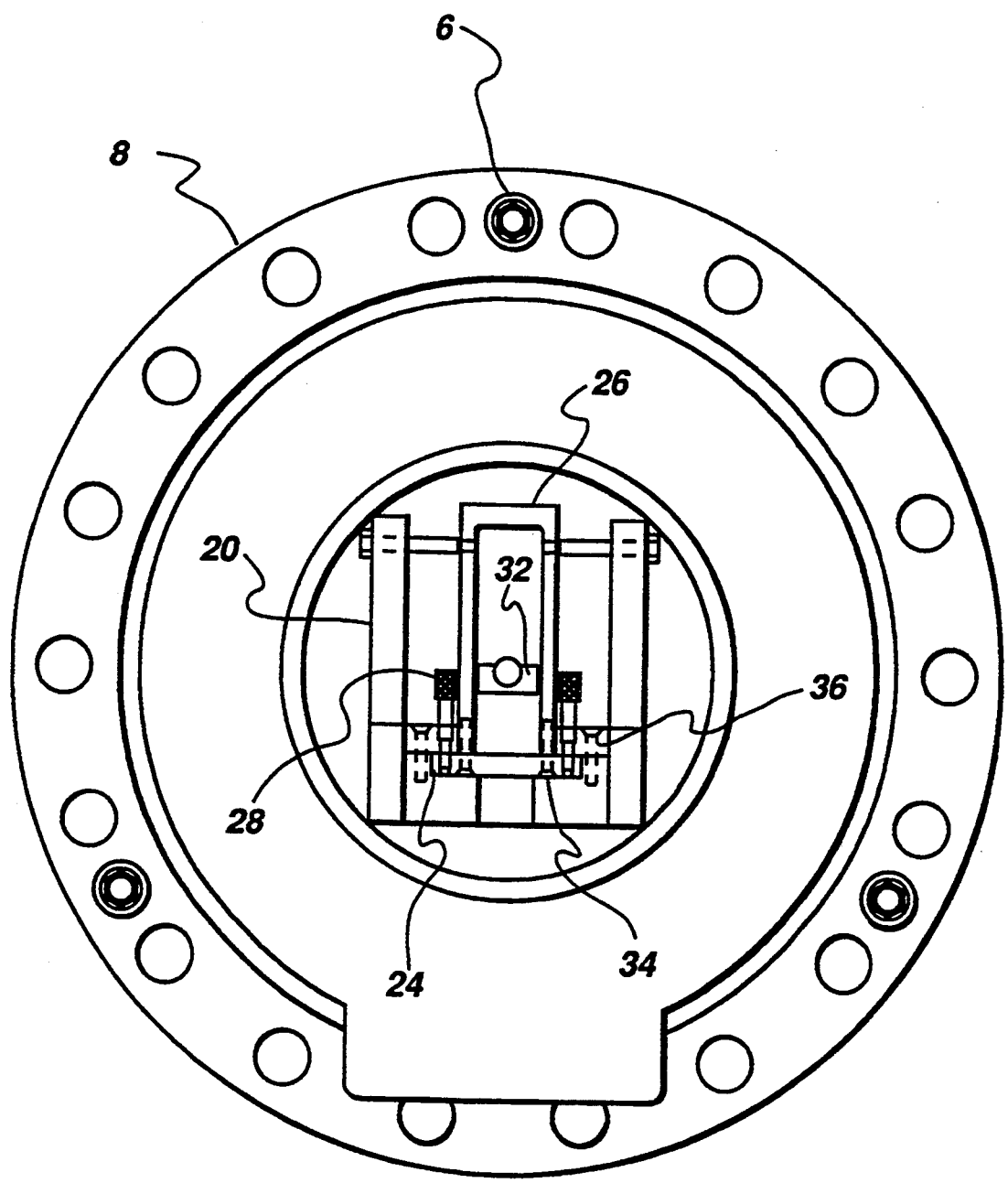
FIG. 2 is a end view of the mapping fixture, according to the present invention.

FIG. 2 illustrates an end view of the mapping fixture 2. As can be seen, holder 20 is U-shaped as well as guide 26. Also, one can see that the rotation of holder 20 along with the movement of probe 32 will provide the appropriate measurement of the magnetic field within the superconducting magnet (not shown).

The importance of mapping fixture 2 will now be described. Fixture 2 is made from Delrin® 510 for its low molecular weight and high strength. Fixture 2 measures the magnetic field of the superconducting magnet (not shown) at two end points, and at 16 points over 11 cross-sectional circles for a total of 178 points. The axial locations of the circles are located by sliding probe holder 26, which is rigidly attached to axle 24, axially through the groove formed between holder 20 and support plate 27 and fixing holder 26 by the index pin 28. Radial locations are located by moving the probe 32 within holder 26 up and down along holes 30 and fixing probe 32 by a conventional dual radial pin (not shown). Circumferential positions are located by rotating the end cap 10 and fixing holder 20 by the index pin 16.

Once given the above disclosure, many other features, modification or improvements will become apparent to the skilled artisan. Such features, modifications or improvements are, therefore, considered to be a part of this invention, the scope of which is to be determined by the following claims.

What is claimed is:

1. A mapping apparatus for measuring the magnetic field of a superconducting magnet, wherein said apparatus is comprised off
   a retainer ring;
   an end plate rigidly connected to said retainer ring;
   a holder connected to said end plate and rotatable to circumferential positions with respect to said end plate;
   a guide connected to said holder and slidable to axial locations with respect to said holder; and
   a magnetic field measuring probe connected to said guide at one of a plurality of radial locations on said guide.

2. The apparatus of claim 1, also including an axle fastened to said guide and further including support plates fastened to said holder to define a rail for said axle.

3. The apparatus of claim 2, also including a first index pin retaining said holder in one of said circumferential positions with respect to said end plate.

4. The apparatus of claim 3, also including a second index pin retaining said guide in one of said axial locations with respect to said holder.

5. The apparatus of claim 4, wherein said magnetic field measuring probe includes a nuclear magnetic resonance probe.

* * * * *